United States Patent [19]

Youden

[11] Patent Number: 5,620,286

[45] Date of Patent: Apr. 15, 1997

[54] FLYCUTTING MACHINE FOR MANUFACTURING PRINTED CIRCUIT BOARDS

[75] Inventor: David H. Youden, Clayton, N.C.

[73] Assignee: Rank Taylor Hobson, Ltd., England

[21] Appl. No.: 336,847

[22] Filed: Nov. 9, 1994

[51] Int. Cl.⁶ ........................................ B23C 3/00
[52] U.S. Cl. .......................... 409/157; 409/184; 409/188; 409/195
[58] Field of Search ..................... 409/145, 156, 409/157, 184, 185, 187, 188, 193, 194, 195, 147, 227, 149; 29/424, 847

[56] References Cited

U.S. PATENT DOCUMENTS

| | | |
|---|---|---|
| 2,911,766 | 11/1959 | Jones . |
| 3,552,002 | 1/1971 | Barron . |
| 3,563,133 | 2/1971 | Asman et al. .................. 409/184 X |
| 3,628,243 | 12/1971 | Phol et al. . |
| 3,690,220 | 9/1972 | Escobedo ......................... 409/211 |
| 4,268,946 | 5/1981 | Eisenberg ........................ 29/424 |
| 4,272,215 | 6/1981 | Davert et al. .................. 409/184 X |
| 4,343,083 | 8/1982 | Takemura et al. . |
| 4,369,007 | 1/1983 | Canady . |
| 4,403,107 | 9/1983 | Hoffman . |
| 4,532,152 | 7/1985 | Elarde . |
| 4,561,815 | 12/1985 | Trevarrow ....................... 409/227 |
| 4,585,379 | 4/1986 | Nagayama et al. . |
| 4,604,799 | 8/1986 | Gurol .............................. 29/847 |
| 4,657,778 | 4/1987 | Moran . |
| 4,738,746 | 4/1988 | Clariou . |
| 4,883,392 | 11/1989 | Lieser . |
| 4,904,340 | 2/1990 | Miracky et al. . |
| 5,069,002 | 12/1991 | Sandhu et al. . |
| 5,094,574 | 3/1992 | Nishigai et al. ................ 409/195 X |
| 5,115,561 | 5/1992 | Kawamura et al. . |
| 5,137,597 | 8/1992 | Curry, II et al. . |
| 5,218,761 | 6/1993 | Maniwa et al. . |
| 5,240,551 | 8/1993 | Matsumura et al. . |

FOREIGN PATENT DOCUMENTS

| | | | |
|---|---|---|---|
| 3834717 | 1/1990 | Germany ......................... 409/188 |
| 642136 | 1/1979 | U.S.S.R. ......................... 409/184 |

Primary Examiner—William R. Briggs
Attorney, Agent, or Firm—Lerner, David, Littenberg, Krumholz & Mentlik

[57] ABSTRACT

A flycutting apparatus and a method of manufacturing printed circuit boards are disclosed. The flycutting apparatus may include a sensor for detecting changes in the relative positioning of an associated rotatable flywheel and the surface of an object, such as a web of flexible printed circuit board, to be machined. The sensor is adapted to send signals to an adjustment device of the flycutting apparatus during machining operations whereby the adjustment device responds to the signals by adjusting the relative position of the rotatable flywheel with respect to the surface of the object. The flycutting apparatus may include a horizontally arranged slide assembly in conjunction with a vertically arranged slide assembly and a translation device for translating movement of the horizontally arranged slide assembly to vertical movement of an associated rotatable flywheel along the vertical slide assembly. The flycutting apparatus may be used to manufacture printed circuit boards without requiring the use of photoresist and acid-based etching solutions.

32 Claims, 10 Drawing Sheets

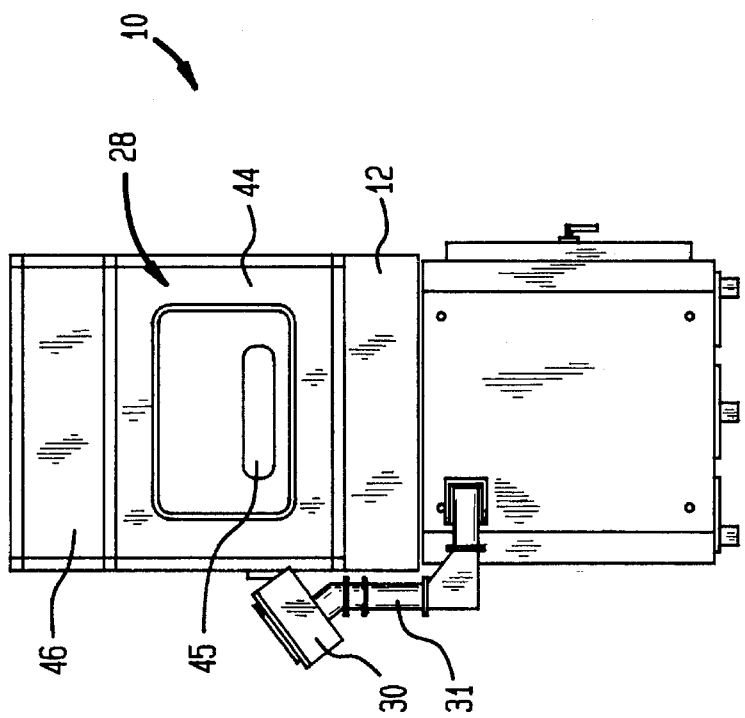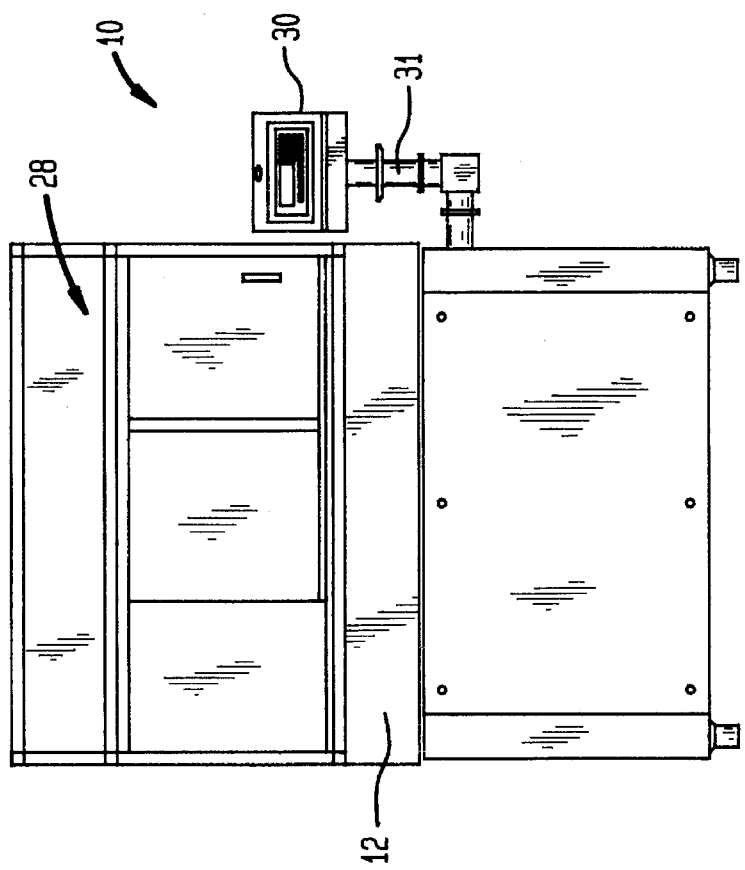

FLYCUTTING MACHINE FOR MANUFACTURING PRINTED CIRCUIT BOARDS

FIELD OF THE INVENTION

The present invention pertains to flycutting machines and methods of manufacturing printed circuit boards. In particular, the present invention pertains to a flycutting machine for use in manufacturing printed circuit boards without requiring the use of photoresist and acid-based solutions.

BACKGROUND OF THE INVENTION

Printed circuit boards are vital components of devices used in many different types of technologies. In fact, the printed circuit board industry is a multi-billion dollar industry that is essential for efficient worldwide manufacturing efforts, the defense industry and electronic based consumer products.

A significant drawback associated with the use of printed circuit boards relates to the manner in which printed circuit boards are usually manufactured. In particular, the common method of manufacturing printed circuit boards utilizes a photoresist masking process. Such a process usually requires that a circuit pattern is transposed onto a film, such as a negative film. A blank circuit board, which may include an insulating layer, such as MYLAR, and a conductive layer, which may include copper, glued to the surface of the insulating layer, is then provided. The conductive surface of the blank circuit board is then exposed to a photoresist composition.

At this time, the film including the circuit pattern thereon is transposed on the photoresist treated circuit board to form an assembly. This assembly is then usually placed in a dark room and exposed to light having light waves of a preselected frequency sufficient to initiate chemical reactions in the exposed areas of the photoresist material. The areas covered by the circuit pattern on the film are not exposed to light and thus do not undergo any additional chemical reactions at this time.

The exposed areas of the photoresist material become bonded to the conductive surface of the printed circuit board. The unexposed areas of photoresist material are then washed off of the printed circuit board with a suitable solution. The remaining pattern of photoresist material on the printed circuit board represents the desired printed circuit pattern to be formed.

An acid-based solution is then applied to the surface of the printed circuit board including the photoresist material and the conductive material. Application of the acid solution etches away all of the exposed conductive material from the surface of the printed circuit board while the areas protected by the photoresist material remain on the surface of the printed circuit board. At this time, the surface of the printed circuit board displays a printed circuit pattern including photoresist material over a conductive pattern and exposed insulated material. Upon completion of the etching process, the printed circuit board is then immersed in a cleaning solution, or cleaned in an otherwise acceptable manner. As a final step, it is often desirable to process the printed circuit board in a wave soldering machine so that a layer of solder is applied to the exposed conductive surface pattern on the printed circuit board. The application of solder as an additional layer on top of the copper layer is desirable because it facilitates soldering electrical components to the printed circuit board during manufacturing operations.

Although the aforementioned process of manufacturing printed circuit boards is widely used, several significant drawbacks exist in connection with such a process. One obvious drawback relates to the use of large amounts of acid and photoresist which need to be disposed of. Additionally, the photoresist masking process requires the use of large amounts of solvents, which also pose a disposal problem. Accordingly, thousand of gallons of toxic solvents and acid-based solutions are used each month to manufacture printed circuit boards in accordance with the photoresist masking process discussed above.

The present invention addresses the shortcomings by providing a flycutting apparatus and a method for manufacturing printed circuit boards without using many of the chemicals associated with the photoresist masking process. To this end, the present invention contemplates using a flycutting machine to manufacture printed circuit boards without the use of hazardous chemicals. Further, the flycutting machine of the present invention may include a sensor to permit automatic or manual adjustment during machining operations to assure that the associated printed circuit boards are being machined to a proper depth.

The flycutting machine of the present invention may be used in various applications other than manufacturing printed circuit boards as disclosed herein. Prior art flycutting machines have been used to manufacture highly reflective surfaces and surfaces that require a high degree of accurate planarization. However, no known flycutting machine includes means for permitting vertical adjustment of the rotatable flycutting disk during machining operations.

SUMMARY AND OBJECTS OF THE INVENTION

One aspect of the present invention pertains to a flycutting apparatus for use during the manufacture of printed circuit boards, and other machining operations. The flycutting apparatus comprises first support means for supporting an object having a surface to be machined. In accordance with a preferred use, the object may be a web of flexible printed circuit board material. The flycutting apparatus also comprises a rotatable flywheel having cutting means thereon for removing a predetermined amount of material from the surface of the object during machining operations. The flycutting apparatus also includes second support means for supporting the rotatable flywheel at an adjustable position with respect to the surface of the object. Adjustment means are provided for adjusting the relative position of the rotatable flywheel with respect to the surface of the object while machining operations are being performed. Preferably, the flycutting apparatus also includes sensor means for detecting changes in the relative position of the rotatable flywheel with respect to the surface of the object being machined whereby the sensor means is adapted to send signals to the adjustment means during machining operations and whereby the adjustment means responds to the signals by adjusting the relative position of the rotatable flywheel with respect to the surface of the object being machined.

It is also preferable for the flycutting apparatus of the present invention to comprise means for receiving an elongate web of material such as flexible printed circuit board material, and for feeding the web of material onto the first support means whereby the material is continuously machined by the rotatable flywheel. The first support means may comprise a substantially flat surface so that optimal machining of the elongate web may be obtained. The substantially flat surface may include a platen.

It is also preferable for the flycutting apparatus of the present invention to comprise a rotatable spindle which has a longitudinal axis extending therethrough. The adjustment means may include a motor operatively connected to the rotatable spindle whereby the rotatable spindle is caused to rotate about its longitudinal axis in response to power supplied from the motor. Preferably, the rotatable flywheel is connected to the rotatable spindle for coaxial rotation therewith.

Although various cutting means may be arranged on the rotatable flywheel for performing machining operations in accordance with the present invention, the cutting means preferably comprises a plurality of diamond cutting tools.

In another preferred embodiment, the rotatable spindle and the rotatable flywheel is connected to the second support means for slideable movement therealong. The second support means may include a vertical slide assembly having bearing means thereon for facilitating smooth slideable motion of the rotatable spindle.

It is also preferable for the flycutting apparatus of the present invention to comprise means for retaining the elongate web of material substantially flush against the first support means. The means for retaining the elongate web of material flush against the first support means may comprise compressed air means for forcing compressed air onto a portion of the elongate web so that it is retained substantially flush against the first support means. In another preferred embodiment, the means for retaining the elongate web of material flush against the first support means comprises vacuum means arranged beneath the first support means in operative relation to the elongate web so that it may be drawn flush against the first support means. In still another embodiment, the means for retaining the elongate web flush against the first support means may comprise both the compressed air means and the vacuum means.

In yet another preferred embodiment, the adjustment means of the present invention may comprise a microprocessor adapted to process signals received from the sensor means and to transmit the process signals to the motor whereby desired relative positioning of the rotatable flywheel and the surface of the object is obtained. In such a preferred embodiment, the sensor means may comprise an optical sensor adapted to detect variations in the relative positioning of the rotatable flywheel on the surface of the object being machined. In an alternate embodiment, the sensor means may comprise means for detecting variations in friction between the cutting means of the rotatable flywheel and the surface of the object.

In still another preferred embodiment, the second support means may include a vertical slide assembly adapted to permit vertically slideable movement of the rotatable flywheel. In this preferred embodiment, the adjustment means may comprise a motor and a substantially horizontally arranged operating means operatively connected to the motor and extending generally perpendicular to the vertical slide assembly. The adjustment means may also include translation means for translating movement of the operating means into vertical movement of the rotatable flywheel along the vertical slide assembly.

It is preferable for the operating means to comprise a horizontally arranged lead screw having a first end operatively connected to the motor and a second end operatively connected to the translation means. It is also preferable for the translation means to comprise a wedge-shaped object arranged for slideable horizontal movement in response to rotation of the lead screw. Such a wedge-shaped object may include a substantially flat lower surface and a tapered upper surface. In a particularly preferred embodiment, the tapered upper surface of the wedge-shaped object may be arranged to form an angle of about 5.7 degrees with respect to the substantially flat lower surface thereof.

In yet another preferred embodiment, the translation means may comprise an air bearing arranged on the tapered upper surface of the wedge-shaped object. In this preferred embodiment, the air bearing is adapted to be displaced along the vertical axis in response to horizontal movement of the wedge-shaped object whereby vertical movement is thus imparted to the rotatable flywheel along the vertical slide assembly. In this preferred embodiment, rotation of the horizontally arranged lead screw is utilized to obtain precise vertical movement of the rotatable flywheel.

In still another preferred embodiment, the flycutting apparatus of the present invention need not include sensor means or adjustment means which corresponds with the sensor means to adjust the relative position of the rotatable flywheel during machining operations. In such a preferred embodiment, the flycutting apparatus may comprise first support means for supporting an object, such as an elongate web of printed circuit board material, having a surface to be machined by the flycutting apparatus; a rotatable flywheel having cutting means thereon for removing a predetermined amount of material from the surface of the object during machining operations; a motor for providing power to the flycutting apparatus; a substantially horizontally arranged operating means operatively connected to the motor for movement in response thereto; a vertical slide assembly for supporting the rotatable flywheel at an adjustable position with respect to the surface of the object; and translation means for translating movement of the operating means into vertical movement of the rotatable flywheel along the vertical slide assembly.

In accordance with another aspect of the present invention, a method of manufacturing printed circuit boards is disclosed. The method preferable comprises the steps of providing a flycutting apparatus, such as one of the flycutting machines discussed above in accordance with the preferred embodiments, which includes a rotatable flywheel having removal means for removing a predetermined amount of material from the surface of a partially manufactured printed circuit board. It is also preferred for the flycutting apparatus to include support means for supporting the partially manufactured printed circuit board during machining operations. The partially manufactured printed circuit board may comprise at least one layer of electrically conductive material and at least one layer of substantially non-conductive material transposed in adjacent relation to each other. The partially manufactured printed circuit board may have a preselected pattern impressed thereon so that upper and lower levels of the electrically conductive material are formed adjacent upper and lower levels of substantially non-conductive material layer.

In accordance with the present invention, the method further comprises the steps of placing the partially manufactured printed circuit board on the support means between the support means and the rotatable flywheel, positioning the removal means of the rotatable flywheel adjacent the upper level of the at least one layer of the electrically conductive material so that a predetermined amount of the conductive material layer is removed whereby a preselected surface pattern of the electrically conductive and substantially nonconductive material layers are exposed, detecting a change in the relative positioning of the removal means and the partially manufactured printed circuit board, and thereafter adjusting the relative positioning of the removal means and the partially manufactured printed circuit board in a response to the detected change while machining operations are being performed.

According to this aspect of the present invention, the partially manufactured printed circuit board preferably comprises a substantially flexible elongate web, and the step of placing the partially manufactured printed circuit board on the support means comprises feeding the elongate web between the support means and the removal means of the rotatable flywheel while machining operations are being performed.

In another preferred embodiment, the step of positioning the removal means adjacent to the upper level of the electrically conductive material comprises determining the amount of material which needs to be removed from the electrically conductive layer and the substantially non-conductive layer, and thereafter lowering the rotatable flywheel to a preselected position so that the removal means removes the required amount of material.

It is preferable for the step of detecting a change in the relative positioning between the removal means and the partially manufactured printed circuit board to comprise activating an optical sensor to generate a signal in response to a change in the relative position between the removal means and a preselected location on the partially manufactured printed circuit board. According to this preferred aspect of the present invention, the signal generated by the optical sensor may be transmitted to adjustment means of the flycutting apparatus.

According to another preferred method, the step of detecting a change in the relative positioning between the removal means and the partially manufactured printed circuit board comprises activating means for detecting variations in friction between the removal means and the partially manufactured printed circuit board to generate a signal in response to a change in the relative position between the removal means and a preselected location on the partially manufactured printed circuit board. The signal generated by the friction detecting means is transmitted to adjustment means of the flycutting apparatus.

According to another preferred method, the step of detecting a change in the relative positioning between the removal means and the partially manufactured printed circuit board comprises visually examining the surface of the printed circuit board after it has been machined to ascertain whether proper positioning of the rotatable flywheel and the object has been obtained. Such visual examination may be performed by an operator or an inspector to assure compliance with desired manufacturing standards. This preferred method of the present invention may also comprise the step of manually activating the adjustment means to generate a signal in response to a change in the relative position between the removal means and a preselected location on the partially manufactured printed circuit board.

In another preferred embodiment, the flycutting apparatus may comprise a motor, a substantially horizontally arranged operating means operatively connected to the motor and extending generally perpendicular to a vertical slide assembly on which the rotatable flywheel is slideably mounted, and translation means for translating movement of the operating means into vertical movement of the rotatable flywheel along the vertical slide assembly. In such a preferred embodiment, the step of adjusting the relative position of the removal means and the partially manufactured printed circuit board may comprise activating the motor in response to the detected change in the relative position between the removal means and the partially manufactured printed circuit board, activating the operating member in response to the motor, causing at least a portion of the translation means to slide along a horizontal axis in response to movement of the operating member and translating the horizontal motion into slideable vertical motion of the rotatable flywheel along the vertical slide assembly whereby an adjusted position of the removal means is obtained during machining operations.

Further in accordance with this aspect of the present invention, the operating means may comprise a lead screw having a first end operatively connected to the motor, and a second end operatively connected to the translation means, whereby the lead screw is rotated in response to activation of the motor.

The translation means of the flycutting apparatus used in accordance with the method of the present invention may comprise a wedge-shaped object for slideable horizontal movement in response to rotation of the lead screw. The wedge-shaped object preferably includes a substantially flat lower surface and a tapered upper surface and is arranged for slideable movement along a horizontal axis in response to rotation of the lead screw. The translation means may also comprise an air bearing arranged on the tapered upper surface of the wedge-shaped object wherein the air bearing is adapted to be displaced along a vertical axis in response to horizontal movement of the wedge-shaped object so that vertical movement is imparted to the rotatable flywheel along the vertical slide assembly.

In accordance with another preferred method of the present invention, the flycutting apparatus may comprise a microprocessor adapted to process signals received as a result of detection of change in the relative position between the removal means and the partially manufactured printed circuit board. The processed signals may be transmitted by the microprocessor to the motor whereby the motor is activated to rotate the lead screw so that precise vertical movement of the rotatable flywheel is achieved.

In accordance with a further step of a preferred method of the present invention, the elongate web of printed circuit board material may be retained flush against the first support means by application of vacuum means arranged beneath the first support means for retaining the material via vacuum force against the first support means.

Accordingly, it is an object of the present invention to provide a flycutting apparatus which permits adjustment of the rotatable flywheel during machining operations in response to detected signals so that the relative position of the rotatable flywheel with respect to the surface of an object being machined may be obtained.

It is another object of the present invention to provide a flycutting apparatus which can be used to manufacture printed circuit boards without using photoresist and acid etch techniques.

It is another object of the present invention to provide a flycutting apparatus which can be used to remove a predetermined amount of electrically conductive material arranged above substnatially non-conductive material on a printed circuit board so that a selected conductive printed circuit pattern may be exposed.

It is a further object of the present invention to provide a flycutting apparatus which includes means for obtaining vertical adjustment of an associated rotatable flywheel by utilizing a horizontally arranged lead screw in operative association with a motor and a vertical slide assembly.

It is yet another object of the present invention to provide a flycutting apparatus which can be used to obtain particularly accurate vertical adjustments by utilizing a relatively simple and inexpensive adjustment mechanism.

It is still another object of the present invention to provide a flycutting apparatus which may include a horizontally oriented lead screw which causes a wedge to move along the horizontal axis in response to rotation of the lead screw. Horizontal movement of the wedge, in turn, causes vertical movement of an associated rotatable flycutting disk along a vertical axis.

It is yet another object of the present invention to provide a flycutting apparatus which includes a safety stop feature, i.e., a self-locking feature, which will assure that an associated rotatable flywheel will not move along the vertical axis if power to the associated motor is lost.

The above summary, as well as further objects, features and advantages of the present invention will be more fully understood when considered in view of the following description of the present invention and the accompanying drawings.

BRIEF DESCRIPTION OF THE DRAWINGS

FIG. 2 is a front view of a second embodiment of the flycutting apparatus of the present invention wherein various assemblies thereof are arranged within an enclosure.

FIG. 4 is the right side view of the flycutting apparatus shown in FIG. 2.

DETAILED DESCRIPTION OF THE PREFERRED EMBODIMENTS

Figure 1:
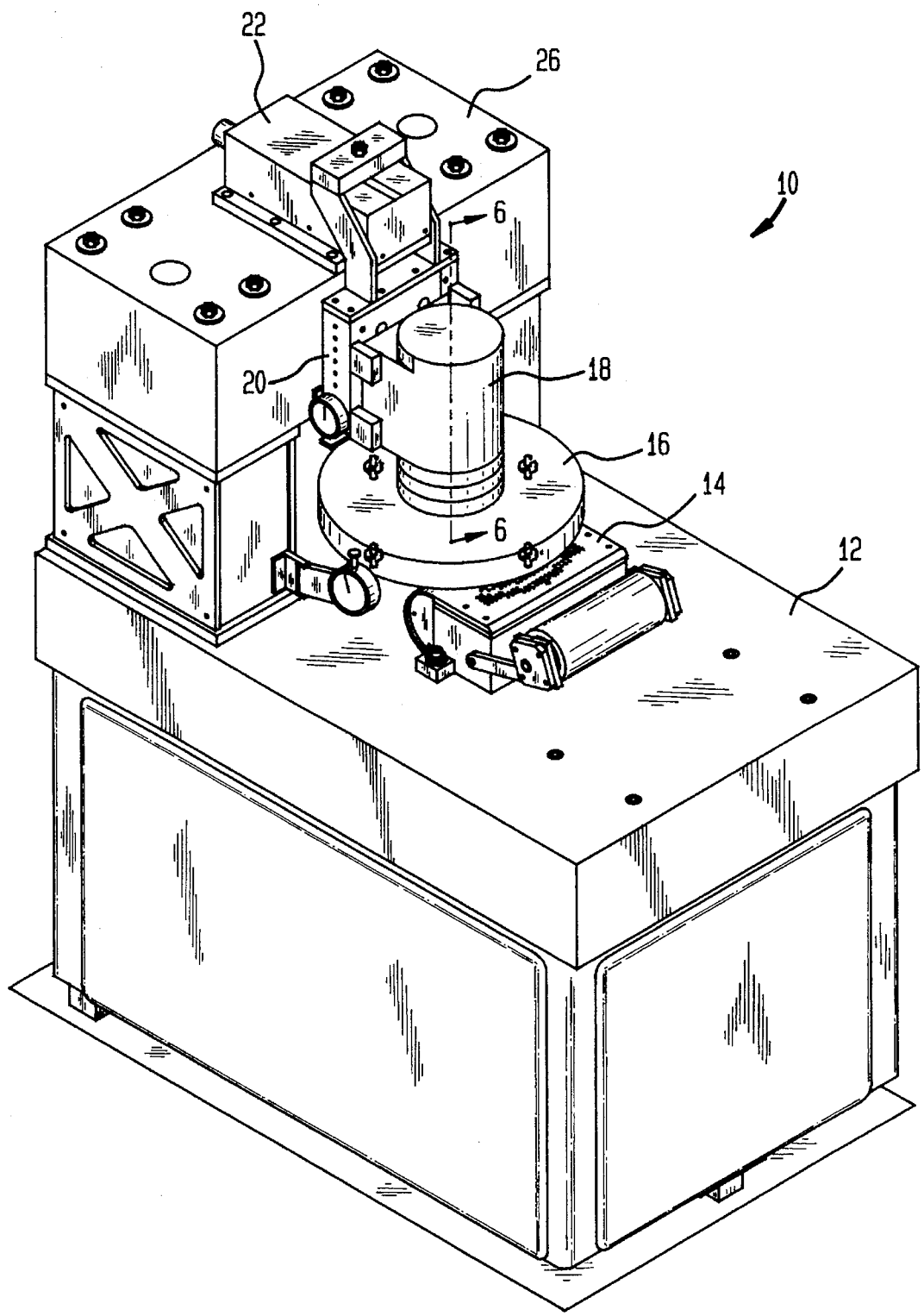
FIG. 1 is a perspective view of one embodiment of the flycutting apparatus of the present invention.

One embodiment of the flycutting apparatus of the present invention is generally identified by reference numeral 10 in FIG. 1. For the purpose of clearly illustrating the general features of the flycutting apparatus 10 of the present invention, the embodiment shown in FIG. 1 does not include a main enclosure assembly, such as the enclosure assembly 28 shown in the embodiment of FIGS. 2–4.

As clearly illustrated in FIG. 1, the flycutting apparatus includes a base assembly 12 which may be constructed of granite. This material offers excellent thermal stability, while insuring a high degree of vibration damping. However, it should be appreciated that various other suitable materials may be selected for the purpose of providing a base assembly for the flycutting apparatus 10. The platen assembly 14 is secured to the surface of the granite base 12. To best serve its purpose in accordance with the present invention, the platen assembly 14 is kinematically mounted to the surface of the granite base 12. The kinematic arrangement of the platen assembly 14 is well-known in the flycutting apparatus art and will thus not be discussed with particularity herein. Preferably, the platen assembly 14 will comprise at least two components. The top component of the platen assembly 14 may be removed for servicing or may be replaced if it should become worn or cracked due to excessive use. A more detailed discussion of the platen assembly 14 is set forth below with particular reference to FIG. 10.

Figure 5:
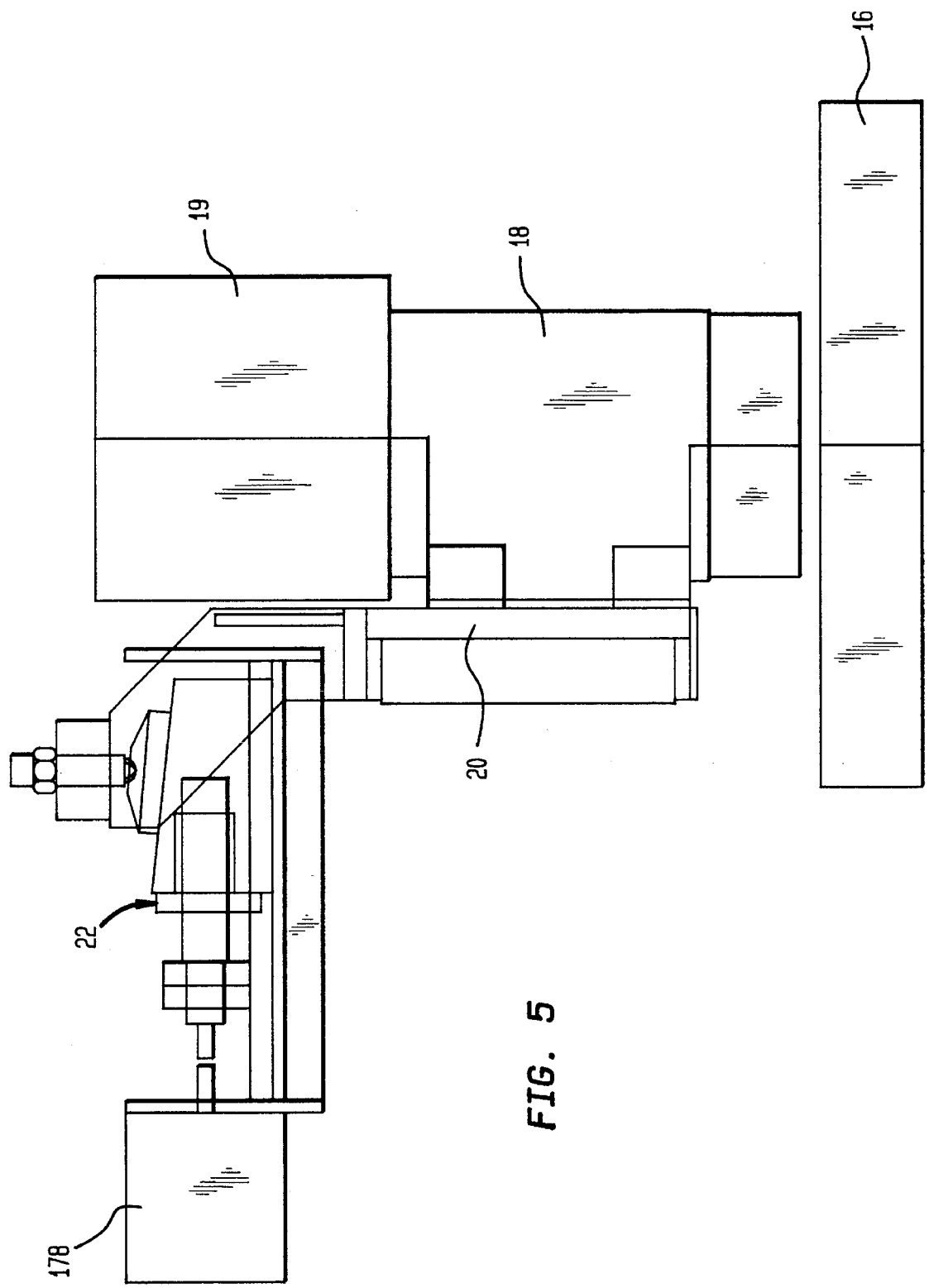
FIG. 5 is a front partially transparent view of selected assemblies of the flycutting apparatus shown in FIG. 1.

A flywheel assembly 16 is shown in FIG. 1 as being mounted in a location above the platen assembly 14. The particular structure and arrangement of the flywheel assembly 16 will also be discussed in detail hereinbelow. The flywheel assembly 16 is rotatably mounted to an enclosed spindle assembly 18. The spindle assembly 18 is operatively connected to a spindle motor 19 as shown in FIG. 5. The spindle motor 19 is arranged within the enclosure of the spindle assembly 18 in FIG. 1 and is thus not shown in that illustration.

The spindle assembly 18 is slideably mounted to a vertical slide assembly 20 as shown in FIGS. 1 and 5. The importance of this vertically slideable arrangement will become more apparent when considered in combination with the additional components of the flycutting apparatus 10 and the operation thereof as discussed below.

A horizontal slide assembly 22 is operatively connected to the vertical slide assembly 20 and is mounted on a bridge structure 26. As shown in FIG. 1, the bridge structure 26 extends across the granite base assembly 12 and supports various operative components of the flycutting apparatus 10. As with the base assembly 12, the bridge structure 26 may be constructed of granite. As such, the bridge structure 26 provides a high degree of thermal stability and vibration damping.

In a preferred embodiment, the flycutting apparatus may include a main housing enclosure assembly 28 as illustrated in FIGS. 2 and 4. The main housing enclosure assembly 28 may be constructed in various ways as its purpose is simply to protect other more sensitive assemblies of the present flycutting apparatus. In a preferred embodiment, the main housing enclosure assembly 28 comprises multiple enclosure components. This feature of the present invention is shown in detail in the exploded view of FIG. 3. The main housing enclosure assembly 28 serves the purpose of protecting various assemblies of the flycutting apparatus while keeping contaminants away from undesired areas and preventing an operator from gaining access to moving parts during machining operations. As can be appreciated from the disclosure in FIGS. 1 and 2, the main housing enclosure assembly 28 covers the bridge structure 26, the spindle assembly 18, the flywheel assembly 16 and the platen assembly 14.

In particular, the main housing enclosure assembly 28 may include two or more front doors slideably arranged with respect to each other, such as inside front door 32 and outside front door 34. A door handle 36 may be secured to the outer surface of outside front door 34 to permit unobstructed slideable movement thereof. The inside and outside front doors 32 and 34 may be mounted in lower and upper door tracks, 38 and 40, respectively. The slideable outside front door 34 and inside front door 32 permits an operator to have access to various components of the flycutting apparatus 10 when one of the slideable doors are moved to an open position. The front of the main housing enclosure assembly 28 is completed by an upper front panel 42, which may include a design, such as a manufacturer's trademark. In this regard, the present flycutting apparatus 10 may be marketed under the trademark DRI-CIRCUIT FLYCUTTER.

Figure 3:
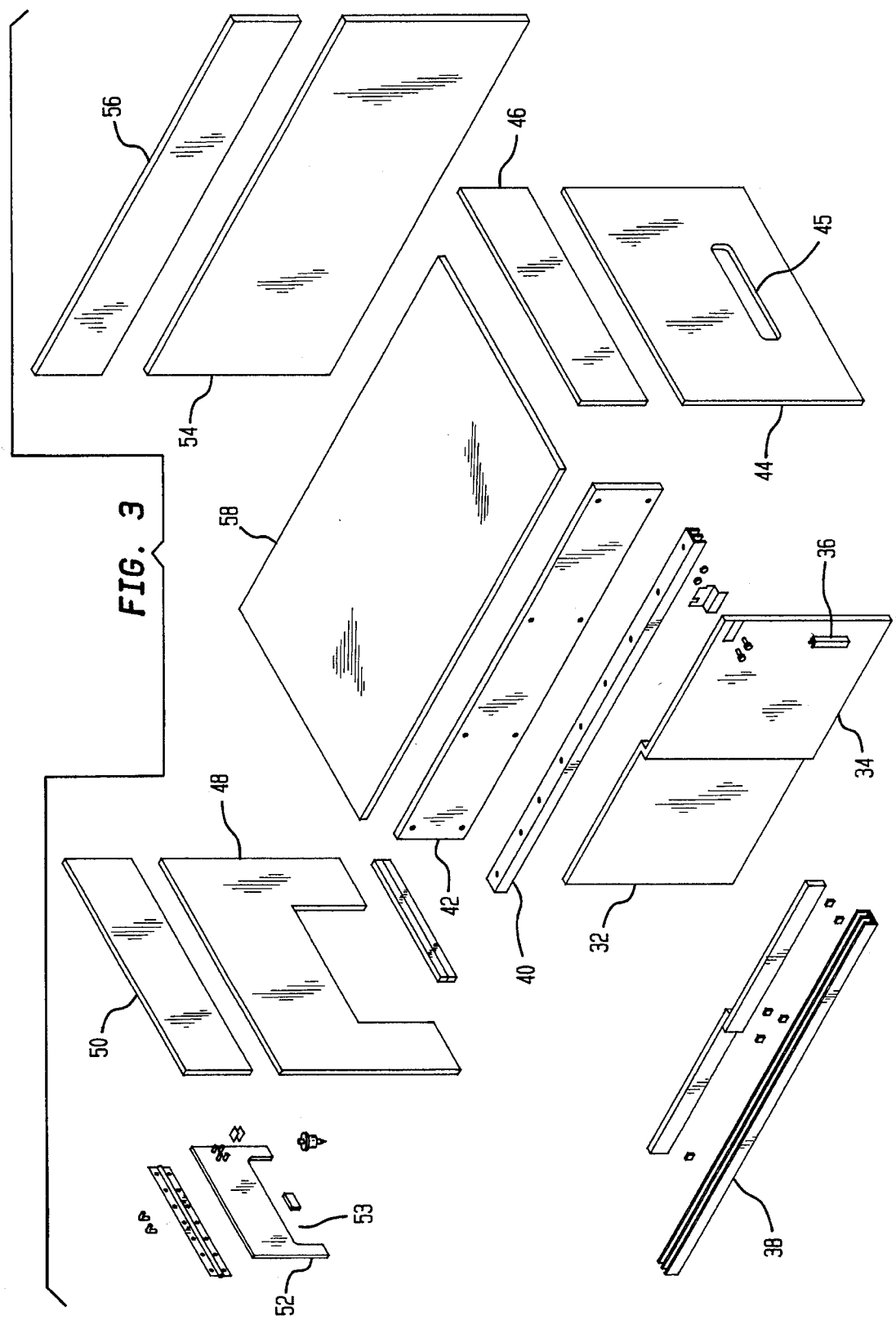
FIG. 3 is an exploded view of the enclosure assembly shown in FIG. 2 illustrating selected components thereof.

As clearly illustrated in FIG. 3, the main housing enclosure assembly 28 also includes a right side entrance panel 44 and a right side upper end panel 46. The entrance panel 44 includes a rectangular passageway 45 which is sized and shaped to permit a web of material, such as flexible printed circuit board material, to be fed into the flycutting apparatus 10 so that it can be properly machined therein. As also illustrated in FIG. 3, the main housing enclosure assembly 28 includes a first left side exit panel 48 and an upper end panel 50. A second left side exit panel 52 including an exit passageway 53 may be arranged in correspondence with a relatively large passageway through exit panel 48 so that a web of flexible printed circuit board material can be transported out of the flycutting apparatus 10 after machining operations have been performed thereon. The main housing enclosure assembly 28 also includes a lower rear panel 54 and an upper rear panel 56. A top panel 58 completes the main housing enclosure assembly 28 and may be secured to the upper panels 42, 46, 50 and 56 in a well-known manner. Of course, the main housing enclosure assembly 28 may include various structures other than the structure shown in FIG. 3. In this regard, the main housing enclosure assembly may comprise an integral unit, or a unit having less components than that specifically disclosed in FIG. 3. Preferably, the main housing enclosure assembly 28 also includes a plurality of bracket and frame components (not shown) which act as a skeleton upon which the multiple components shown in FIG. 3 are supported.

As illustrated in FIGS. 2 and 4, the flycutting apparatus 10 also includes a display and control panel assembly 30 which may be used by an operator to ascertain when different control operations that need to be performed, and to provide an input to the electrical system of the flycutting apparatus 10 to actuate desired control functions. The particular display signals that may appear on the display control panel 30, as well as the control functions which may be inputted by an associated keypad, will be discussed below in connection with the operation of the flycutting apparatus.

The display and control panel assembly 30 may be connected to the base assembly 12 by a connector assembly 31 as illustrated in FIGS. 2 and 4. The connector assembly 31 may comprise a plurality of conduits through which electrical cable may be placed for electrically connecting the display and control panel assembly 30 to desired areas of the main electrical control system of the flycutting apparatus 10.

Figure 6:
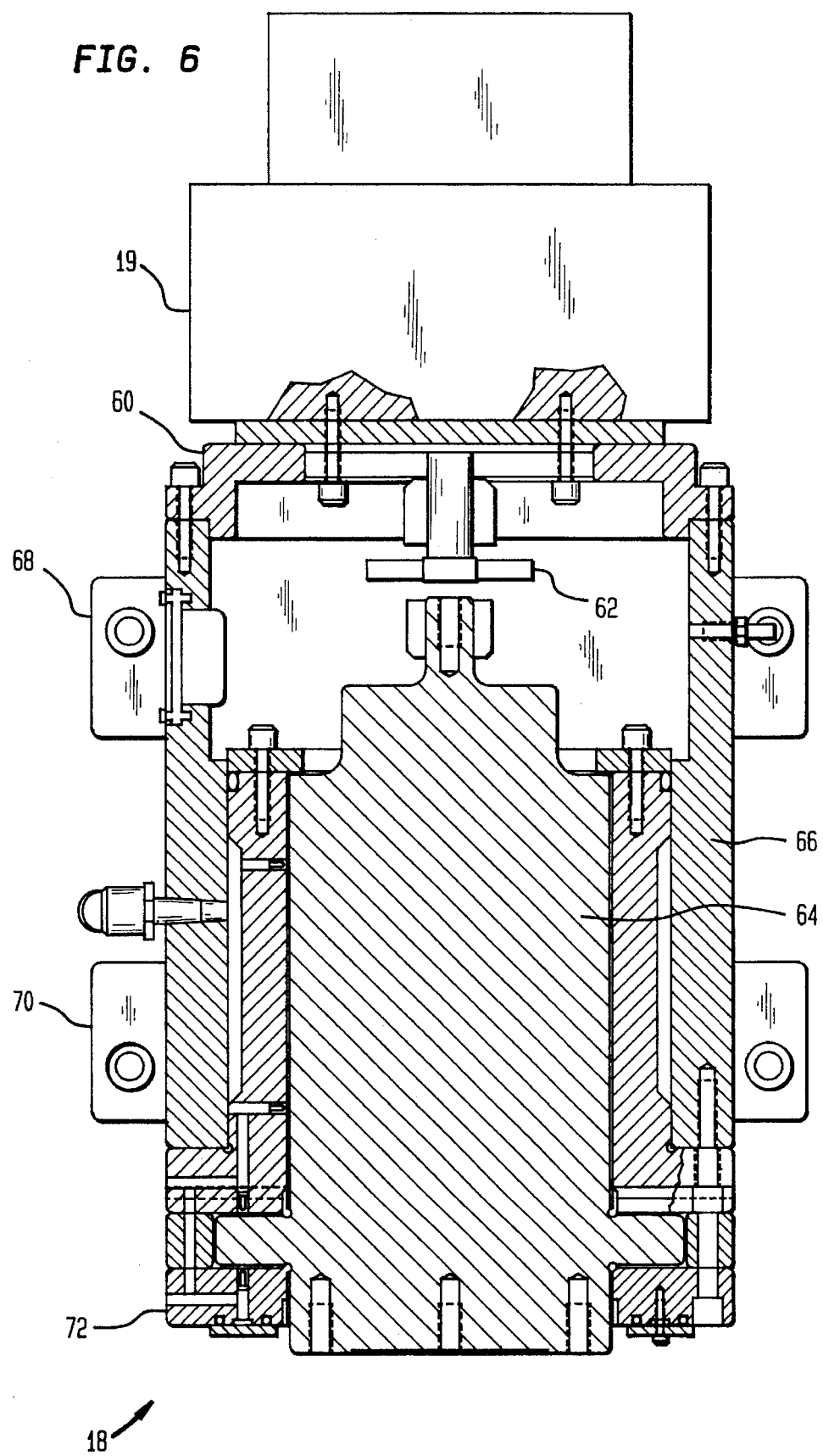
FIG. 6 is a cross-sectional view taken along line VI—VI of the spindle assembly shown in FIG. 5.

The spindle assembly 18 may include some or all of the features of prior art flycutting machines, such as a flycutting machine manufactured by Pneumo Precision, Inc. of Keene, N.H. as Model No. MG500. As illustrated in FIG. 6, the spindle assembly 18 is operatively connected to a drive motor 19 via motor adaptor plate 60 and coupling 62. The shaft 64 is mechanically engaged to the coupling 62 in a manner known in the art. The spindle assembly 18 includes an enclosure wall 66 which isolates the internal components thereof. Preferably, the spindle assembly 18 is an orifice type air bearing spindle. The shaft 64 may be constructed from hardened stainless steel and may include a bronze journal for high reliability. Although various spindle speeds may be obtained by using the structure described herein and shown in FIG. 6, it is expected that the spindle speed will be infinitely variable up to about 2,000 revolutions per minute (rpm). Of course, in alternate preferred embodiments, the maximum spindle speed may be well in excess of 2,000 rpm.

The structure of the spindle of the present invention will also permit dynamic braking capability so that the spindle can be selectively brought to an abrupt stop, if necessary during testing and manufacturing operations. The spindle air bearings are protected by housing assemblies 68 and 70. A bearing plate 72 is arranged at an end of the spindle, remote from the drive motor 19. The bearing plate 72 is used to facilitate connection to a flywheel assembly 16.

Flywheels of the type used in the flycutting apparatus 10 of the present invention have been used in the prior art for various machining operations. It should therefore be appreciated that various prior art flywheels may be used in accordance with the present invention to perform the preferred methods of manufacturing printed circuit boards.

Figure 7:
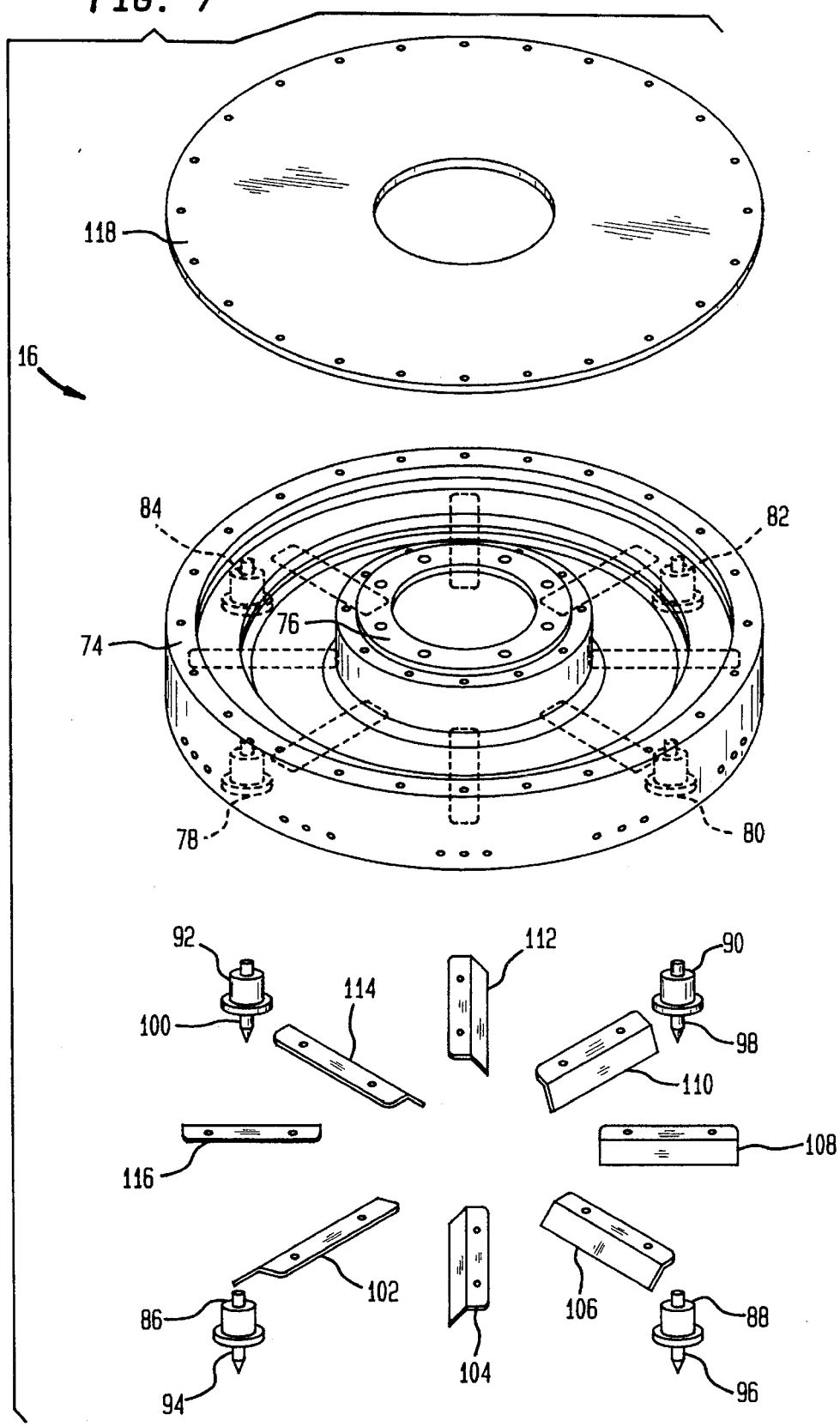
FIG. 7 is an exploded perspective view of the rotatable flywheel shown in FIGS. 1 and 5.

FIG. 7 shows an exploded view of one embodiment of the flywheel assembly 16 in accordance with the present invention. As particularly shown in FIG. 7, the flywheel assembly 16 comprises a flycutter wheel 74 which may include a center hub 76 in which the spindle assembly 18 may be attached. A plurality of tool holder ports 78–84 are arranged within the flycutter wheel 74 for receiving corresponding tool bit holders 86–92 in a one-to-one relationship. Diamond cutting tools 94–100 are arranged in respective tool bit holders 86–92, also in a one-to-one relationship. This aspect of the present invention is clearly shown in FIG. 7.

The flycutting apparatus 10 may be supplied with a mechanism which permits simple mounting and adjustment of the diamond cutting tools 94–100 and the tool bit holders 86–92 within the tool holder ports 78–84 of the flycutter wheel 74. Although various methods for mounting and adjusting the diamond tools may be utilized, one preferred method utilizes four Valinite EZ Set adjustable tool holders. These tool holders permit micro-inch adjustment and further facilitate easy mounting of the associated diamond cutting tools 94–100 so that accurate adjustment to the desired height may be obtained by using a tool setting gauge. Such a system would permit installation of four diamond cutting tools at their proper location within about ten minutes.

A plurality of flywheel vanes 102–116 are assembled within the flycutter wheel 74 at selected locations (shown in phantom in FIG. 7). The flywheel assembly 16 is completed by placement of a flywheel cover 118 onto a top shoulder of the flycutter wheel 74. The flywheel cover 118 is then secured to the flycutter wheel 74 in a known manner, such as by means of screws, rivets and the like.

It should be appreciated that the flywheel assembly 16 may be adapted to receive more or less than four diamond cutting tools. Although the flycutter wheel 74 shown in FIG. 7, and discussed above, may have various tool swing diameters, in a preferred embodiment the tool swing diameter may be about nineteen inches. The four tool bit holders 86–92 and the diamond cutter tools 94–100 therein are preferably spaced at equal intervals along the bottom surface of the flycutter wheel 74. In this particular embodiment, the tool swing diameter is calculated to allow only one diamond cutting tool at a time to be engaged with a web of flexible printed circuit board material, which may be twelve inches wide. Such a structure will have the effect of minimizing tooling forces on an associated web.

Figure 8:
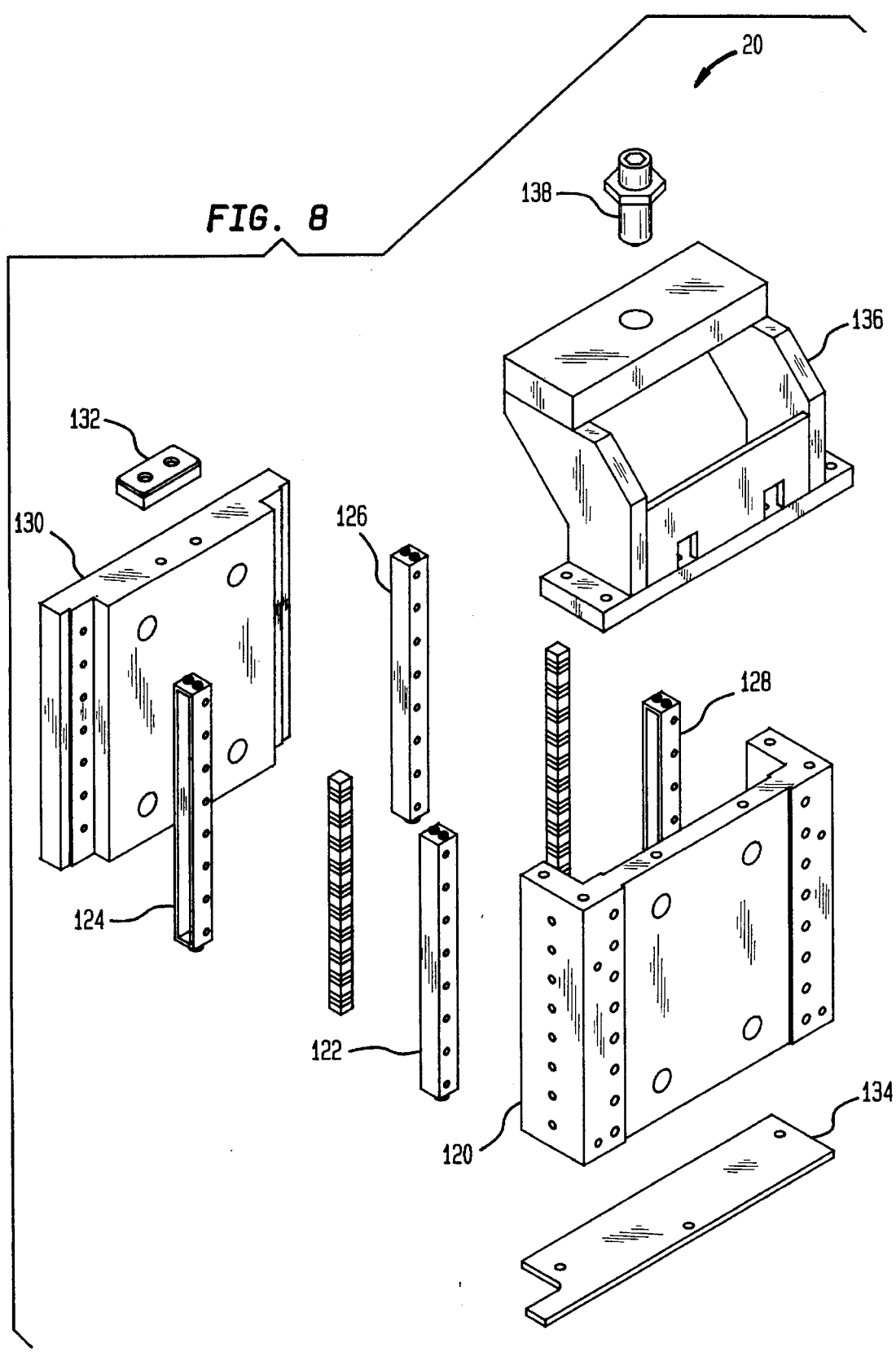
FIG. 8 is an exploded perspective view of the vertical slide assembly shown in FIGS. 1 and 5.

The vertical slide assembly 20 is shown in an exploded view in FIG. 8. In particular, the vertical slide assembly 20 includes a vertical slide carriage 120 which may slide by means of roller ways 122–128 in relation to a slide base 130. A positive stop 132 may be arranged on top of the slide base 130, while a bottom plate 134 may be secured to the bottom surface of the vertical slide assembly 120. A drive bracket 136 is connected to a shoulder on top of the vertical slide carriage 120. The drive bracket 136 may be coupled to the horizontal slide assembly 22 by means of coupling member 138.

For reasons that will be more apparent when discussed below in connection with the operation of the present flycutting apparatus and the novel method of manufacturing printed circuit boards, one particularly novel aspect of the present invention relates to the interrelationship between the horizontal slide assembly 22 and the vertical slide assembly 20.

Figure 9:
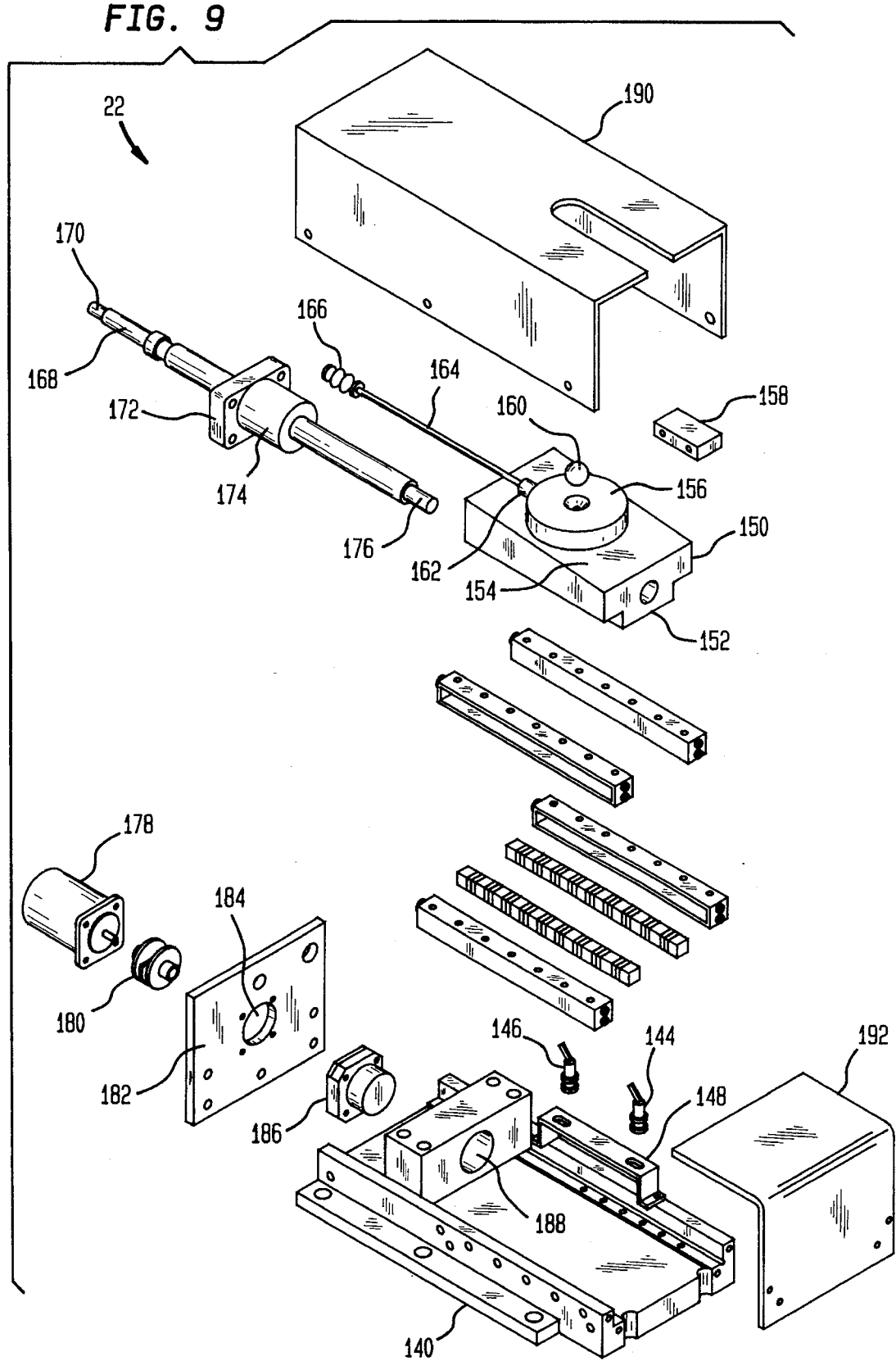
FIG. 9 is an exploded perspective view of the horizontal slide assembly shown in FIGS. 1 and 5.

As clearly shown in FIG. 9, the horizontal slide assembly 22 includes a horizontal slide base 140 having a bearing block 142 arranged thereon. A pair of proximity switches 144–146 are coupled to the horizontal slide base 140 by a proximity switch holder 148.

One particularly creative component of the present invention is represented by the horizontal slide carriage 150 which is substantially wedge-shaped. The horizontal slide carriage 150 includes a substantially flat bottom surface 152 which facilitates slideable movement along a horizontal axis, and a tapered top surface 154.

In a preferred embodiment, the angle formed between the tapered top surface 154 and the substantially flat bottom surface 152 may be about 5.7 degrees. This angle is obtained when the wedge-shaped horizontal slide carriage 150 has an arc having a tangent of about 0.1. The 5.7 degree angle is selected so that the weight of the vertical slide assembly 20 and the spindle assembly 18 preloads an associated air bearing against the weight of the horizontal slide assembly 22 so that no horizontal movement, and therefore no vertical movement, will occur if power supplied by the spindle motor 19 is lost. This is considered a safety stop feature of the present invention, and may be obtainable by utilizing angles other than 5.7 degrees between the tapered top surface 154 and the substantially flat bottom surface 152 of the horizontal slide carriage 150.

An air bearing having the shape of a puck is arranged on the tapered top surface 154 of the horizontal slide carriage 150. A proximity switch actuator 158 is also placed in correspondence with the horizontal slide carriage 150 to selectively actuate proximity switches 144 and 146.

A steel ball, which may have a diameter of about three-quarter of an inch, is arranged in correspondence with the air bearing puck 156. Air flow is provided to the air bearing puck 156 through conduit 164, which may comprise plastic tubing having an inner diameter of about six mm. A sleeve 162 is used to secure the fit between the conduit 164 and the air bearing puck 156. A bulkhead fitting 166 is arranged on a remote end of the conduit 164 for connection to the air source which provides the air flow to the air bearing puck 156.

A horizontally arranged lead screw 168 is shown in FIGS. 5 and 9. The lead screw 168 has a structure similar to vertically arranged lead screws in prior art flycutting devices. The horizontal lead screw 168 includes a proximal end 170 and a distal end 176. A bearing plate 172 and a central hub 174 are centrally arranged between the proximal and distal ends of the lead screw 168.

A stepping motor 178 is also clearly shown in FIGS. 5 and 9. The stepping motor may be coupled to the proximal end 170 of the horizontal lead screw 168 by means of a coupling 180. A motor mounting plate 182 is utilized to secure the stepping motor in assembled position on the bridge structure 26. As illustrated in FIG. 9, the motor mounting plate 182 includes a central aperture 184 in which the coupling 180 may be mounted. A bearing for support unit 186 may be secured to the motor mounting plate 182 for alignment with the central aperture 184 and a central passageway 188 within the bearing block 142. The apertures through the motor mounting plate 182, the bearing support unit 186, and the bearing block 142 are aligned and are adapted to rotatably support the central hub 174 of the horizontally arranged lead screw 168 when the horizontal slide assembly 22 is in assembled position.

The distal end 176 of the horizontally oriented lead screw 178 is adapted to be retained within a sized passageway of the horizontal slide carriage 150. The vertical movement of the vertical slide assembly 20, which is a result of the rotatable movement of the horizontally oriented lead screw 168 and the slideable horizontal movement of the horizontal slide carriage 150, is a particularly novel aspect of the present invention.

In order to complete the construction of the horizontal slide assembly 22, the components thereof are assembled in an operative manner and a cover 190 is secured to the horizontal slide base 140. An end cover 192 is then assembled to the front of the horizontal slide base 140 and placed in an appropriate position with respect to the cover 190.

An isolated partially transparent view of the assembled relationship between the horizontal slide assembly 22, the vertical slide assembly 20, the spindle assembly 18, including the spindle drive motor 19, and the flywheel assembly 16 is shown for illustrative purposes in FIG. 5. It should be appreciated that the vertical slide assembly 20 supports the air bearing spindle assembly 18. In a preferred embodiment, the vertical slide assembly 20 may include a precision cross roller bearing design as illustrated in the exploded view of FIG. 8. Such a design provides particularly smooth motion of the vertical slide carriage 128 as well as accurate positioning of the flycutting spindle assembly 18. The positioning of the vertical slide carriage 120 is effected as the air bearing puck 156 is moved upward or downward in response to slideable movement of the horizontal slide carriage 150.

The design of the horizontal slide assembly 22 may also preferably include a precision cross roller bearing design. As discussed above and shown in FIG. 1, the horizontal slide assembly 22 is mounted on top of the bridge structure 26. The horizontal slide carriage 150 may be driven along a horizontal plane upon rotatable translation of the horizontally oriented lead screw 168, which, in turn, is driven by the stepping motor 178. Although each step of the stepping motor 178 may be selected to correspond to various specifications, in a preferred embodiment, each step of the stepping motor is selected to move the tapered horizontal slide carriage 150 approximately 0.001 inch. Such horizontal movement will effectuate movement of the vertical slide carriage 120 along the vertical axis by approximately 0.0001 inch. Accordingly, accurate positioning of the flywheel assembly 16 can be achieved.

Figure 10:
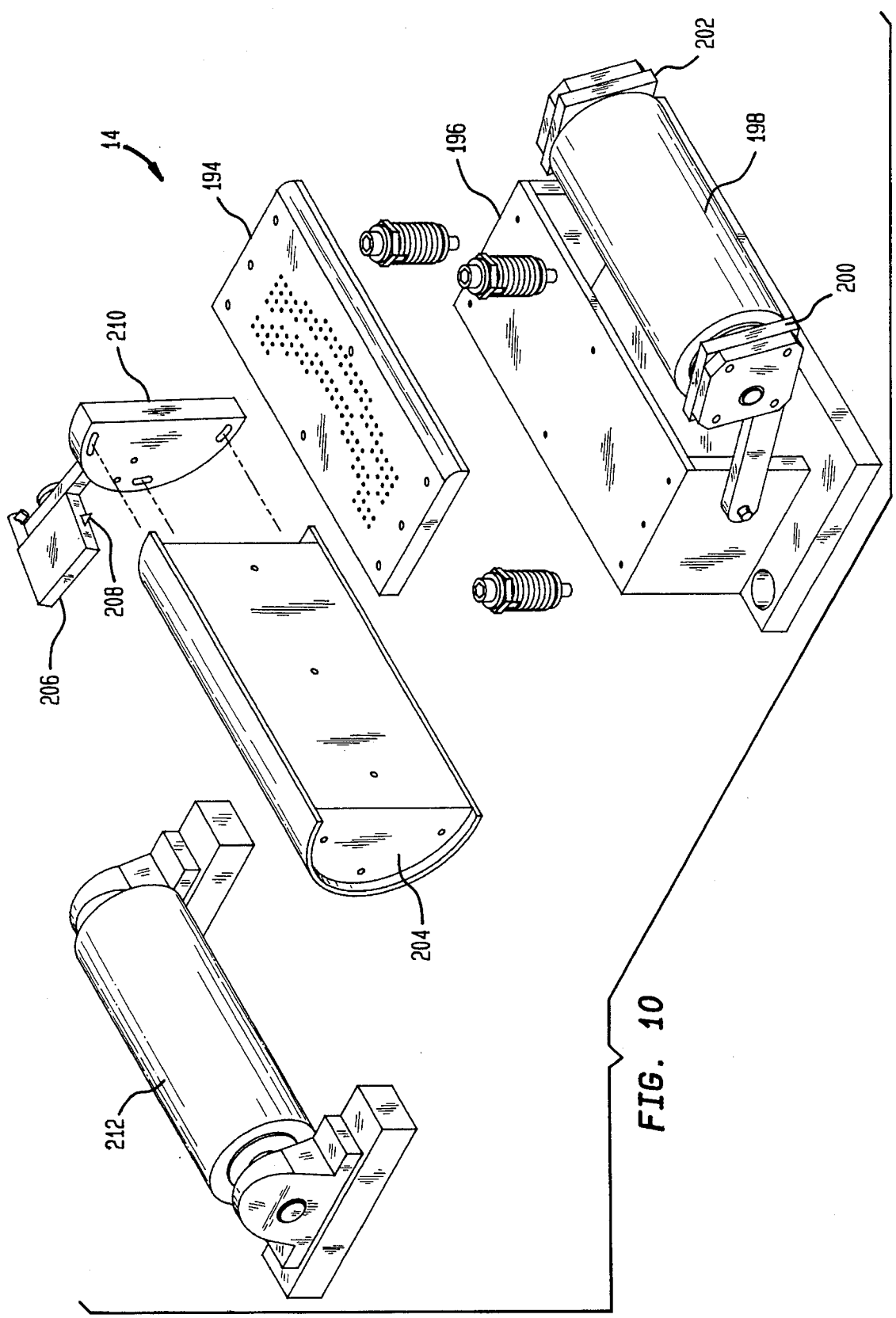
FIG. 10 is a partially exploded perspective view of the platen assembly of the flycutting apparatus of the present invention.

The platen assembly 14 is also associated with a particularly novel aspect of the present invention. The platen assembly 14 is shown in FIG. 10 as comprising a platen 194 having a plurality of appeartures for vacuum suction applications with respect to a web of material, which may be a flexible printed circuit board, which may be placed thereon for machining operations. A base assembly 196 may be secured to the surface of the granite base assembly 12 as clearly shown in FIG. 1.

A rubber covered roller 198 may be mounted on roller pivot arms 200 and 202 in a manner sufficient to permit gravity to force the rubber covered roller 198 onto the surface of the material web being drawn thereunder. The function of the rubber covered roller 198 is to retain the material web in a substantially flattened position as it is drawn over the platen 194. Retention of the material web in a substantially flush position on the surface of the platen 194 is also obtained by vacuum means which preferably operates in conjunction with platen 194 through the plurality of passageways visible from the surface thereof shown in FIG. 10. Such a vacuum suction system is well known in the art and will not be discussed with further particularity herein. Alternatively, or additionally, compressed air source may be arranged on the flywheel assembly 16 to assist in retaining the material web flat on the platen 194.

A skid roll 204 may be secured to one end of the base assembly 196 adjacent the platen 194. Arrangement of the skid roll 204 in this manner will permit a web of printed circuit board material to be drawn over the surface of the skid roll 204 at a preselected angle. The web of printed circuit material may then be drawn beneath a fixed roller assembly 212, which may also be mounted to the surface of the granite base 12. This aspect of the present invention is not readily visible from FIG. 1.

A gauging probe 206 may be mounted to the skid roll 204 by means of a swivel plate 210 and an expansion arm. Gauging probe 206 is preferably an optical probe which is entirely novel with respect to flycutting machines as will be discussed further herein. The gauging probe 206 shown in FIG. 10 also includes a light beam orienting means 208 which serves the purpose of transmitting a light beam in a predetermined position on a web of flexible printed circuit board material as it is drawn across the platen 194.

The particular components of the flycutting apparatus 10 and the combined structural arrangement thereof will be better appreciated when considered in conjunction with a preferred method of operating the flycutting apparatus 10. Accordingly, the operation of the flycutting apparatus 10 will now be discussed with regard to a novel method of manufacturing printed circuit boards which eliminates the need of the prior art approach to manufacturing printed circuit boards, which utilized photoresist and acid-based chemical compositions.

More particularly, one novel method of using the flycutting apparatus 10 relates to the removal of conductive and insulating material, such as copper and MYLAR, to leave a desired printed circuit pattern on a flexible web of printed circuit board material. The method broadly encompasses utilizing the flycutting apparatus 10 to cut or buff off, by means of flycutting operations, unwanted conductive and insulating material from the surface of a previously embossed web of printed circuit board material, such as the substrate shown in FIG. 11. The particular improvements in the present invention include the step of achieving vertical movement of the flycutter wheel 74 during the manufacturing process to account for tolerancing errors in the height of the substrate to be machined, or tolerancing errors that may have occurred during the embossing process, or custom machining specification requirements. As indicated above, the vertical adjustment proposed would be particularly accurate and may include steps of 0.0001 inch or smaller. The particular printed circuit boards which are contemplated to be manufactured by using the flycutting apparatus 10 of the present invention include the flexible printed circuit boards used in automobile dashboards, and various other devices.

It should also be appreciated that the rotatable flycutting disk in prior art flycutters is slideable moveable along one axis thereof so that adjustments can be made either before or after machining operations are performed. Typically, the flycutting disk is moved along a vertical axis. However, some prior art flycutting machines have a pivot assembly which permits the rotatable flycutting disk and its guide bearings to be pivoted from a vertical orientation to a horizontal orientation. In either case, slideable movement of the rotatable flycutting disk along the associated slide bearing is achieved by operating a lead screw which extends parallel to the axis of slideable movement.

The structure of the flycutting apparatus 10 of the present invention permits the horizontally oriented lead screw 168 to translate rotatable movement into slideable movement along the horizontal plane by the tapered horizontal slide carriage 150. The tapered top surface 154 of the horizontal slide carriage 150 forces the air bearing puck 156 upward along the vertical axis while the horizontal slide carriage 150 undergoes horizontal movement. The air bearing puck 156 is fixed against movement along the horizontal axis and is adapted to permit an air cushion to form between the bottom surface thereof and the tapered top surface 154 of the horizontal slide carriage 150. Vertical movement of the air bearing puck 156 effectuates movement of the vertical slide carriage 120, which in turn causes the spindle assembly 18 and the flywheel assembly 16 to move along slide bearings on the vertical axis. The aforementioned structure which permits initial rotation of the horizontally arranged lead screw 168 to translate horizontal movement of the slide carriage 150 into vertical movement of the flywheel assembly 116 is obtained with great accuracy at a relatively inexpensive cost.

The accurate vertical adjustability feature may be tied in with the optical gauging probe 206 when used as contemplated in accordance with the present invention. The probe 206 may thus be adapted to detect when vertical adjustment is needed based on the orientation of the flexible circuit board material drawn over the platen 194. A signal will be sent to the stepping motor 178 through the use of software associated with the optical probe 206, so that an appropriate step-up or step-down in the motor will occur. Thus, horizontal movement and therefore vertical movement will result depending on the signal sent by the software associated with the optical probe 206.

In accordance with the method of the present invention, the substantially continuous web of flexible printed circuit board material may be fed into the flycutting apparatus 10 through a passageway, such as passageway 45 in the right side entrance panel 44 of the main housing enclosure assembly 28. The web is then fed beneath the rubber covered roller 198 and is drawn flush against the platen 194. The web continues at an angle over the skid roll 204 and is drawn beneath the fixed roller assembly 212. The flexible printed circuit material then continues through the passageway in the exit panel 48 in the passageway of the exit door 52 on the left side of the main housing enclosure assembly 28.

It is contemplated that the flexible material web will be roll-fed from right to left by a continuous feeder as described above and is ultimately drawn away from the flycutting apparatus 10 by a remote take-up device. The width and thickness of the material web may vary depending on particular applications. The width of the material web will generally be about 12 inches. However, in custom applications, the width of the material may be wider or narrower than 12 inches.

Figure 11:
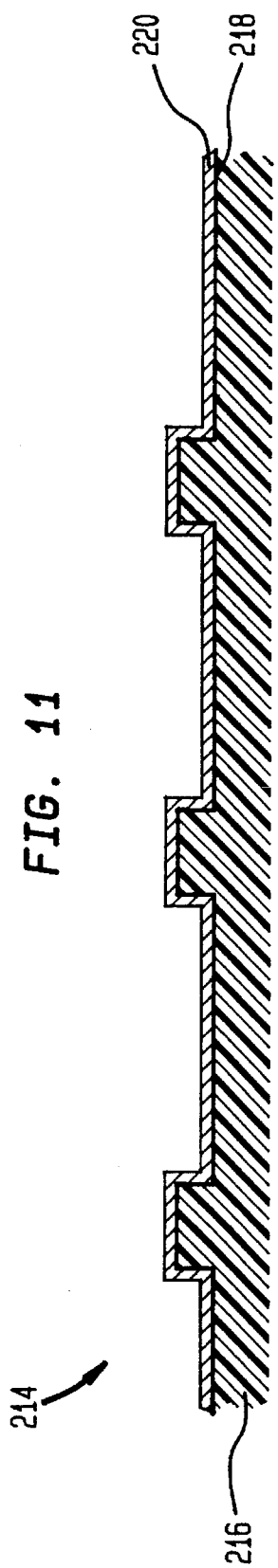
FIG. 11 is a cross-sectional view of a pre-embossed portion of a printed circuit board suitable to be machined by the present invention.

Flexible printed circuit board material 214, suitable to be machined by the flycutting apparatus 10, is shown in cross section in FIG. 11 after it has been subjected to an embossing process. As shown, the printed circuit board material 214 is pre-embossed with a printed circuit pattern but has not yet been subjected to machining operations by the flycutting apparatus 10. The structure of the printed circuit board material 214 is well known in the art and preferably includes an insulating substrate 216, which may be made of MYLAR. A conductive layer 220, which may be copper, is arranged on top of the insulating layer 216 and is affixed thereto, and separated therefrom, by a thin layer of glue 218.

Pre-embossing of the printed circuit material 214 is performed prior to the flycutting operations by an embossing machine (not shown) which produces a series of high and low patterns of the copper layer 220 glued to the MYLAR layer 216. In order to create a desired conductive circuit pattern, the flycutting apparatus 10 of the present invention is used to remove the high portions of copper material 220, as well as the raised portions of the MYLAR substrate 216 so that a desired printed circuit pattern is left. Although the particular substrate discussed herein comprises the flexible printed circuit board material 214, it should be understood that various substrates, including other types of printed circuit boards, and other conductive or nonconductive materials, can be machined by using the flycutting apparatus 10 of the present invention.

During cutting operations, the high portions of the copper layer 220 of the printed circuit board material 214 are exposed to one or more of the diamond cutters 94–100 on the flycutter wheel 74 as it is drawn over the platen 194. The underside of the flycutting wheel 74 may include means for forcing air downward onto the printed circuit board material 214 as it crosses the flycutting platen 194. This will assist in keeping the MYLAR substrate 216 of the printed circuit board material 214 substantially flush against the top surface of the platen 194. Of course, this is an optional feature, which is not necessary for proper operation of the present invention.

After the desired amount of the high portions of the copper layer 220 and the MYLAR substrate 216 have been removed by one or more of the diamond cutting tools 94–100 on the rotatable flycutter wheel 74, the machined surface of printed circuit board material 214 is exposed to a light beam transmitted through light beam orienting means 208 of the gauging probe 206. A portion of the transmitted light beam is reflected back toward the gauging probe 206. The probe 206 then detects the degree of intensity of the reflected light beam. The software provided in association with the probe 206 compares the recorded intensity of the light beam reflected from the surface of the recently cut printed circuit board material 214 with predetermined and preprogrammed values of reflective intensity. Based on the comparison between the intensity of the reflected light beam and the predetermined value of reflective intensity, one or more signals are then sent from the probe 206 to a controller shown in the flow chart of FIG. 12.

One suitable controller is manufactured by Allen Bradley and is marketed as model number PLC 500. Although the particular signals sent by the probe 206 in accordance with the software thereof may vary in different applications, it is contemplated that the signals are sent through a three bus line and/or a two bus line. The three bus line is an error status bus which is suitable for transmitting a three digit binary code to the PLC. For example, the error status bus may thus be used to selectively send one of the following codes:

000—no error
001—no signal
010—no test signal
011—out of range
100—inconsistent results
101—web speed error
110—noisy data
111—acknowledge (handshaking)

The two bus line which may transmit data from the probe 206 to the PLC may be considered a web thickness bus suitable for transmitting one of four possible codes. Examples of these codes are:

00—OK
01—Too high
10—Too low
11—Not used

It should be appreciated that operation of the flycutting apparatus 10 of the present invention may be selectively placed in one of two modes. The first mode may be a manual mode, during which an operator can manually adjust the stepping motor to a proper cutting position with respect to an associated web of printed circuit material. In this mode, the operator will be informed by a digital display panel, such as the display and control panel assembly 30 shown in FIGS. 2 and 4. The data displayed on the display and control panel 30 can be supplied from the PLC, and will be indicative of information conveyed along the error status bus and the web thickness bus. Once the operator reads appropriate instructions from the display and control panel assembly 30, the operator can then select a control function from a key pad thereon to selectively cause the stepping motor 178 to step up or step down the desired number of steps. Accordingly, the display and control panel 30 is adapted for two way communication with the PLC.

The flycutting apparatus 10 may also be operated in an automatic mode. In this mode, vertical adjustments of the flywheel assembly 16 occur automatically as the stepping motor 178 receives signals indicative of the signals provided to the PLC via the error status and web thickness buses.

Figure 12:
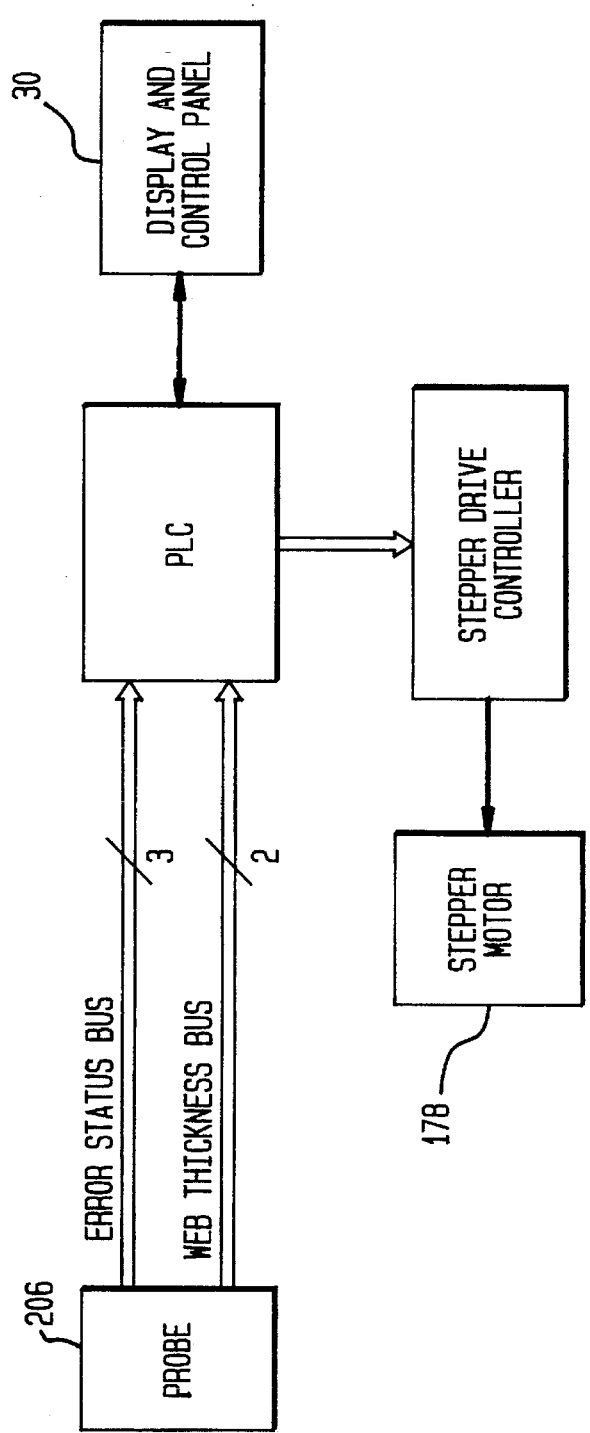
FIG. 12 is a flowchart schematically illustrating communication paths between the sensor probe and the adjustment means of the flycutting apparatus of the present invention.

As shown in FIG. 12, the stepping motor 178 does not receive signals directly from the PLC. Instead, a second controller, such as the stepper drive controller shown in FIG. 12, receives digital signals from the PLC and processes those signals before sending them to the stepping motor 178. The PLC and the stepper drive controller are both preferably arranged in an electrical control panel (not shown) of the flycutting apparatus 10. In one preferred embodiment, the stepper drive controller and the stepper motor 178 may be manufactured as a single assembly connected by appropriate electrical cables. One acceptable stepper drive and motor assembly is manufactured by Parker as model number PK2.

Although the probe 206 of the present invention has been described above as comprising an optical probe, which can detect or measure, via associated software, the intensity of reflected light beams, and can then compare the detected intensity with preprogrammed known parameters, in other embodiments, a substitute probe may be utilized which is not an optical probe. For example, a friction sensing probe may be used which detects applied friction between the diamond cutter tools 94–100 and the printed circuit board material. In such an embodiment, the detected friction may be compared to a known value to determine whether vertical adjustment of the flywheel assembly 16 is required. Further, other existing probes, or future technologically advanced probes, may be utilized in connection with the present invention while keeping within the spirit of the novel aspects discussed herein.

While the foregoing description and figures are directed toward the preferred embodiments in accordance with the present invention, it should be appreciated that numerous modifications can be made to each of the components of flycutting apparatus 10 and in the method of manufacturing printed circuit boards. Indeed, such modifications are encouraged to be made in the materials, structure, arrangement and steps of the disclosed embodiments and methods of the present invention without departing from the spirit and scope of the same. Thus, the foregoing description of the preferred embodiments should be taken by way of illustration rather than by way of limitation with respect to the present invention, which is defined by the claims set forth below.

I claim:

1. A flycutting apparatus comprising:

first support means for supporting an object having a surface to be machined; a rotatable flywheel having cutting means thereon for removing a predetermined amount of material from said surface of said object during machining operations; second support means for supporting said rotatable flywheel at an adjustable position with respect to said surface of said object; adjustment means for adjusting the relative position of said rotatable flywheel with respect to the surface of said object while the machining operations are being performed; means for receiving an elongate web of material and feeding said web of material onto said first support means whereby said material is continuously machined by said rotatable flywheel; and sensor means for detecting changes in the relative position of said rotatable flywheel and said surface of said object, said sensor means being adapted to send signals to said adjustment means during machining operations whereby said adjustment means responds to said signals by adjusting the relative position of said rotatable flywheel with respect to said surface of said object.

2. A flycutting apparatus comprising:

first support means for supporting an object having a surface to be machined by said flycutting apparatus; a rotatable flywheel having cutting means thereon for removing a predetermined amount of material from the surface of said object during machining operations; a motor; a substantially horizontally arranged operating means operatively connected to said motor for movement in response thereto; a vertical slide assembly for supporting said rotatable flywheel at an adjustable position with respect to the surface of said object; means for receiving an elongate web of material and feeding said material past said first support means whereby said material is continuously machined by said rotatable flywheel; and translation means for translating movement of said operating means into vertical movement of said rotatable flywheel along said vertical slide assembly.

3. The flycutting apparatus of claim 1 wherein said first support means comprises a substantially flat surface.

4. The flycutting apparatus of claim 3 wherein said substantially flat surface comprises a platen.

5. The flycutting apparatus of claim 2 wherein said cutting means comprised at least one diamond cutting tool arranged on said rotatable flywheel.

6. The flycutting apparatus of claim 1 wherein said cutting means comprises at least one diamond cutting tool arranged on said rotatable flywheel.

7. The flycutting apparatus of claim 6 wherein said cutting means comprises a plurality of diamond cutting tools.

8. The flycutting apparatus of claim 2 wherein said first support means comprises a substantially flat surface.

9. The flycutting apparatus of claim 1 further comprising means for retaining said elongate web of material substantially flush against said first support means.

10. The flycutting apparatus of claim 9 wherein said means for retaining said elongate web of material flush against said first support means comprises compressed air means for forcing compressed air onto a portion of said elongate web so that said material is retained substantially flush against said first support means.

11. The flycutting apparatus of claim 9 wherein said means for retaining said elongate web of material flush against said first support means comprises vacuum means arranged beneath said first support means for retaining said material web substantially flush against said first support means.

12. The flycutting apparatus of claim 2 further comprising a rotatable spindle having a longitudinal axis extending there through, said rotatable spindle being operatively connected to said motor whereby said rotatable spindle is caused to rotate about said longitudinal axis in response to power supplied from said motor, said rotatable flywheel being connected to said rotatable spindle for coaxial rotation therewith.

13. The flycutting apparatus of claim 1 wherein said sensor means comprises an optical sensor adapted to detect variations in the relative positioning of said rotatable flywheel and the surface of said object being machined.

14. A flycutting apparatus comprising:

first support means for supporting an object having a surface to be machined; a rotatable flywheel having cutting means thereon for removing a predetermined amount of material from said surface of said object during machining operations; second support means for supporting said rotatable flywheel at an adjustable position with respect to said surface of said object; adjustment means for adjusting the relative position of said rotatable flywheel with respect to the surface of said object while the machining operations are being performed; and sensor means for detecting changes in the relative position of said rotatable flywheel and said surface of said object, said sensor means comprises means for detecting variations in friction between said cutting means of said rotatable flywheel and the surface of said object being machined, said sensor means being adapted to send signals based on said detected frictional variations to said adjustment means during machining operations whereby said adjustment means responds to said signals by adjusting the relative position of said rotatable flywheel with respect to said surface of said object.

15. The flycutting apparatus of claim 1 wherein said second support means includes a vertical slide assembly adapted to permit vertically slideable movement of said rotatable flywheel, and said adjustment means comprises a motor, a substantially horizontally arranged operating means operatively connected to said motor and extending generally perpendicular to said vertical slide assembly, and translation means for translating movement of said operating means into vertical movement of said rotatable flywheel along said vertical slide assembly.

16. The flycutting apparatus of claim 15 wherein said operating means comprises a lead screw having a first end operatively connected to said motor, and a second end operatively connected to said translation means.

17. The flycutting apparatus of claim 16 wherein said translation means comprises a wedge-shaped object arranged for slideable horizontal movement in response to rotation of said lead screw.

18. The flycutting apparatus of claim 17 wherein said wedge-shaped object includes a substantially flat lower surface and a tapered upper surface.

19. The flycutting apparatus of claim 18 wherein said tapered surface is arranged at an angle of about 5.7° with respect to said lower surface.

20. The flycutting apparatus of claim 18 wherein said translation means further comprises an air bearing arranged on said tapered upper surface, said air bearing being adapted to be displaced along the vertical axis in response to horizontal movement of said wedge-shaped object whereby vertical movement is imparted to said rotatable flywheel along said vertical slide assembly.

21. The flycutting apparatus of claim 20 wherein said adjustment means further comprises a microprocessor adapted to process signals received from said sensor means and to transmit said processed signals to said motor whereby said motor is activated to rotate said lead screw so that precise vertical movement of said rotatable flywheel is achieved.

22. The flycutting apparatus of claim 5 wherein said cutting means comprises a plurality of diamond cutting tools.

23. The flycutting apparatus of claim 12 wherein said rotatable spindle and said rotatable flywheel are connected to said second support means for slideable movement there along, said second support means including a vertical slide assembly having bearing means for facilitating smooth slideable motion of said rotatable spindle.

24. The flycutting apparatus of claim 22 further comprising means for retaining said elongate web of material substantially flush against said first support means.

25. The flycutting apparatus of claim 24 wherein said means for retaining said elongate web of material flush against said first support means comprises compressed air means for forcing compressed air onto a portion of said elongate web so that said material is retained substantially flush against said first support means.

26. The flycutting apparatus of claim 24 wherein said means for retaining said elongate web of material flush against said first support means comprises vacuum means arranged beneath said first support means for retaining said material web substantially flush against said first support means.

27. The flycutting apparatus of claim 2 wherein said operating means comprises a lead screw having a first end operatively connected to said motor, and a second end operatively connected to said translation means.

28. The flycutting apparatus of claim 27 wherein said translation means comprises a wedge-shaped object arranged for slideable horizontal movement in response to rotation of said lead screw.

29. The flycutting apparatus of claim 28 wherein said wedge-shaped object includes a substantially flat lower surface and a tapered upper surface.

30. The flycutting apparatus of claim 29 wherein said tapered surface is arranged at an angle of about 5.7° with respect to said lower surface.

31. The flycutting apparatus of claim 29 wherein said translation means further comprises an air bearing arranged on said tapered upper surface, said air bearing being adapted to be displaced along the vertical axis in response to horizontal movement of said wedge-shaped object whereby vertical movement is imparted to said rotatable flywheel along said vertical slide assembly.

32. The flycutting apparatus of claim 31 further comprising a microprocessor adapted to transmit signals to said motor whereby said motor is activated to rotate said lead screw so that precise vertical movement of said rotatable flywheel is achieved.

* * * * *

UNITED STATES PATENT AND TRADEMARK OFFICE
CERTIFICATE OF CORRECTION

PATENT NO. : 5,620,286
DATED : April 15, 1997
INVENTOR(S) : Youden

It is certified that error appears in the above-identified patent and that said Letters Patent is hereby corrected as shown below:

Column 19, line 41, "22" should read --2--.

Signed and Sealed this

Twenty-second Day of July, 1997

Attest:

BRUCE LEHMAN

*Attesting Officer*    Commissioner of Patents and Trademarks